United States Patent [19]
Anderson

[11] Patent Number: 5,929,982
[45] Date of Patent: Jul. 27, 1999

[54] ACTIVE APD GAIN CONTROL FOR AN OPTICAL RECEIVER

[75] Inventor: Duwayne R. Anderson, Redmond, Oreg.

[73] Assignee: Tektronix, Inc., Wilsonville, Oreg.

[21] Appl. No.: 08/794,799

[22] Filed: Feb. 4, 1997

[51] Int. Cl.⁶ .................................................. G01N 21/00
[52] U.S. Cl. ................................... 356/73.1; 250/214 AG
[58] Field of Search .......................... 356/73.1; 327/514, 327/518; 250/214 AG, 214 LA, 214 LS

[56] References Cited

U.S. PATENT DOCUMENTS

| | | | |
|---|---|---|---|
| 3,604,842 | 9/1971 | Harwood | 178/5.4 AC |
| 4,987,298 | 1/1991 | Inagaki | 250/214 AG |
| 5,012,140 | 4/1991 | Bateman | 307/491 |
| 5,015,839 | 5/1991 | Tanikoshi | 250/214 AG |
| 5,043,608 | 8/1991 | McDonald | 307/491 |
| 5,410,282 | 4/1995 | Larrick et al. | 330/149 |
| 5,491,548 | 2/1996 | Bell et al. | 356/73.1 |
| 5,532,474 | 7/1996 | Dautet et al. | 250/214 R |
| 5,625,181 | 4/1997 | Yasuda et al. | 250/214 A |

Primary Examiner—Robert H. Kim
Assistant Examiner—Tu T. Nguyen
Attorney, Agent, or Firm—William K. Bucher

[57] ABSTRACT

An active avalanche photo-diode, APD, gain control circuit for use in an optical receiver includes a bias generator for varying the bias on a variable gain APD in response to bias control values generated by a controller. The controller receives the output of the optical receiver and determines the system noise of the receiver for the various bias control values. The system noise is compared to a threshold value for establishing the optimum bias for optimum gain of the APD. The gain control circuit is useable in an optical receiver in an optical time domain reflectometer, OTDR, for increasing the dynamic range of the OTDR.

22 Claims, 5 Drawing Sheets

ACTIVE APD GAIN CONTROL FOR AN OPTICAL RECEIVER

BACKGROUND OF THE INVENTION

The present invention relates generally to avalanche photo-diode gain control circuits and more specifically to an active avalanche photo-diode gain control circuit for optimizing the gain of the avalanche photo-diode in an optical receiver usable in an optical measurement instrument, such as an optical time domain reflectometer.

Avalanche photo-diodes (APD) are used in optical receivers for converting an incoming optical signal into an electrical current signal. The current signal is coupled to a transimpedance or logarithmic amplifier for amplification. The output of the amplifier may be coupled to an analog-to-digital converter (ADC) for converting the analog signal into equivalent digital values at the sample rate of the ADC. The digital values may be stored in RAM associated with a digital controller, such as microprocessor, that performs averaging and other operations on the digital data to decrease noise and increase the signal-to-noise (SNR) of the receiver.

One of the APD's most important parameters is the reverse bias voltage associated with breakdown. When operated below breakdown, increases in reverse bias results in signal amplification. As the APD bias increases, the gain and shot noise also increases, but within manageable bounds. This is the region of normal APD operation. However, at the breakdown voltage, dark currents increase exponentially, along with the APD's excess noise and the dark current shot noise. The result of the APD going into breakdown is saturated noise in the optical receiver output, and possible damage or destruction of the APD.

The internal gain of APDs is achieved by collision-induced generation of additional carriers. Because of the high field strength within the APD, photogenerated carriers create subsequent carriers in a cascading effect that results in multiplied photocurrents. The multiplication of photocurrents is given approximately by the equation:

$$G(V) = \frac{1}{1 - (V/V_{br})^2} \quad [1]$$

FIG. 1 illustrates the gain curve for a typical InGaAs APD with a breakdown voltage of 72 volts. The horizontal axis is in volts and the vertical axis is the logarithm (base 10) of the signal gain given by equation 1. As shown in the figure, the gain remains relative constant until it approaches to within a few volts of the breakdown voltage.

If the gain mechanism in an APD was perfect it would multiply the signal and the signal shot noise without adding any excess noise of its own. However, APD gain is not perfect. Besides multiplying the signal and signal shot noise, the APD also adds noise. A statistical statement about the APD's average gain is that on average, each photo-generated carrier leads to the generation of G carriers at the end of the multiplication process. However, on an individual basis, any one carrier that initiates an avalanche may produce more or less than G carriers. This statistical variation in gain for individual photo-generated carriers adds noise to the final multiplied signal. The noise added by the multiplication process is characterized by the excess noise factor. When the multiplication is initiated by electrons, the excess noise factor is given by the equation:

$$F(V) = k \times G(V) + \left(2 - \frac{1}{M}\right)(1 - k) \quad [2]$$

In equation 2, k is the ratio of the electron ionization coefficient ($\alpha$) divided by the hole ionization coefficient ($\beta$) in the detector avalanche region. Typical values for k are 0.02 to 0.04 for silicon, 0.7 to 1.0 for germanium, and 0.3 to 0.5 for InGaAs with InP multiplication regions. FIG. 2 illustrates a typical curve for excess noise in an InGaAs APD. The breakdown voltage is 72 volts and k equals 0.3. The excess noise remains relative constant until within a few volts of the breakdown voltage and then increases very rapidly.

FIG. 1 shows that setting the APD bias close to the breakdown voltage increases the gain of the APD. However, the APD breakdown voltage is a function of temperature, which makes it difficult to set the bias on the APD for optimum gain. To guarantee the APD does not go into breakdown when the optical receiver is operated in a varying temperature environment, such as in optical measurement instruments like an optical time domain reflectometer, the APD bias is set well below the breakdown voltage at room temperature. Setting the bias voltage in this manner assures that the APD will not go into breakdown when the optical receiver is operated over a wide temperature range. Even though the APD is set well below breakdown, the temperature of the optical receiver needs to be monitored to track changes in the breakdown voltage. However, the temperature calibration of the thermistor used to measure the temperature within the optical measurement instrument has some uncertainty. Additionally, the change in breakdown voltage per degree C. of temperature change, q, is an estimated quantity having a relatively large uncertainty. If the uncertainty of q is $\Delta q$ and the temperature change is $\Delta T$, then the bias on the APD needs to be set $\Delta T \times \Delta q$ volts below the breakdown voltage to ensure the APD does not exceed the breakdown voltage. For example, the value of q for a NDL5551P InGaAs APD, manufactured and sold by NEC, Corp., is 0.2%/°C. with a typical breakdown voltage of 70 volts resulting in a value of q=0.14 volts/°C. The manufacturer does specify a tolerance for q but empirical data shows that the tolerance is about $\Delta q$=0.07 volts/°C. In the TFS3031 Mini Optical Time Domain Reflectometer (OTDR), manufactured and sold by Tektronix, Inc., Wilsonville, Oreg. and the assignee of the present invention, the maximum operating temperature for the instrument is listed at 45° C. ambient. This equates to a temperature change of 30° C. with the assumption that the inside fo the instrument is several degrees warmer than the outside temperature after the instrument is warmed up. The possible uncertainty in the APD bias is 30° C.×0.07 volts/°C.=2.1 volts. The maximum temperature differential for cold operation is even greater at about 40° C. As a result the wworst-case uncertainty is about 2.5 volts. Thus, even with temperature tracking and adjustment, the APD bias must be set at about 2.5 volts below breakdown to guarantee the APD will not go into breakdown. Preventing the APD from going into breakdown is a significant requirement in OTDR instrument design because of the possibilities of instrument damage and complete instrument failure if the APD goes into breakdown.

One way to lower the uncertainty in setting the bias voltage of the APD is to provide thermal cooling for the APD. This decreases the temperature range, $\Delta T$, over which the APD operates. However, the uncertainty of the thermistor temperature calibration and the uncertainty of the APD q tolerance value still limits how close the bias on the APD can be set to the breakdown voltage. It also requires additional cost and circuit complexity to thermally cool these devices.

Varying the bias on an APD in an optical measurement instrument, such as an OTDR is known in the art. U.S. Pat. No. 5,043,608, assigned to the assignee of the present invention, describes an avalanche photo-diode non-linearity correction circuit for cancelling a portion of a non-linear recovery error response by the APD to an input signal. The gain of the APD is varied from data acquisition cycle to data acquisition cycle using a bias voltage control circuit with the acquired data being stored. The stored data from consecutive acquisition cycles are combined in a summation circuit to effectively cancel a significant portion of the non-linear recovery error response.

U.S. Pat. No. 5,491,548, assigned to the assignee of the present invention, describes a wide dynamic range optical receiver for use in an optical measurement instrument, such as an OTDR, were an APD is coupled to one or both low and high sensitivity signal channels. A voltage biasing circuit provides the biasing voltage on the APD and is controlled by inputs from a controller. The OTDR acquires waveform data over segments of the fiber under test with gain of the APD being set at different levels for each waveform segment. While these prior designs used variable APD gain to cancel non-linearity recovery error responses and increase the dynamic range of an optical receiver, they did not achieve the optimum gain from the APD due to the uncertainty limitations of preventing the APD from going into breakdown.

What is needed is an active avalanche photo-diode gain control circuit for optimizing the gain of the avalanche photo-diode in an optical receiver and a method for setting the bias on the avalanche photo-diode for optimizing the gain of the APD without risk of exceeding the breakdown voltage of the APD. The gain control circuit and method should bias the APD for the highest APD gain without adding so much noise to the output of the optical receiver that the APD noise dominates the system noise. Further, when used in an optical time domain reflectometer, the gain control circuit and method should increase the dynamic range or signal-to-noise ratio of the OTDR.

SUMMARY OF THE INVENTION

Accordingly, one of the objectives of the present invention is an active avalanche photo-diode gain control circuit for generating an optimum bias for optimizing the gain of a variable gain avalanche photo-diode.

A further objective of the present invention is a method for varying the bias on a variable gain avalanche photo-diode for establishing an optimum gain.

A further objective of the present invention is an optical time domain reflectometer having an active avalanche photo-diode gain control circuit for generating an optimum bias on a variable gain avalanche photodiode for optimizing the gain to increase the dynamic range of the optical time domain reflectometer.

A further objective of the present invention is a method for increasing the dynamic range of an optical measurement instrument, such as an optical time domain reflectometer, using an active avalanche photo-diode gain control circuit for optimizing the gain of a variable gain avalanche photo-diode for increasing the signal-to-noise ratio of the optical measurement instrument.

An additional objective of the present invention is an active avalanche photo-diode gain control circuit where the optimum gain of a variable gain avalanche photo-diode is determined in relation to the system noise of an optical receiver.

The above objectives are met with an active avalanche photo-diode gain control circuit for use in an optical receiver having a variable gain avalanche photo-diode being coupled to a bias generator for biasing the avalanche photo-diode. A controller, coupled to receive the output of the optical receiver, generates varying bias control values that are coupled to the bias generator for varying the bias on the avalanche photo-diode. The controller determines system noise of the optical receiver for the various bias control values and compares the system noise to a threshold value for establishing an optimum bias for optimizing the gain of the avalanche photo-diode and increasing the signal-to-noise ratio of the optical receiver. The bias control values are generated from an initial bias control value producing a bias voltage on the avalanche photo-diode in the range of about five volts below the breakdown voltage with the bias control values being incremented to produce changes in the bias voltage in the range of about 0.1 volts. The threshold value for comparison with the system noise is a statistical measure of the system noise and may be generated using the initial nominal control value.

The method of optimizing the gain of a variable gain avalanche photo-diode in an optical receiver having a signal-to-noise ratio (SNR) includes the steps of generating bias control values for driving a bias generator for varying the bias on the avalanche photo-diode, measuring system noise of the optical receiver for each bias control value, comparing the measured system noise at each bias control value to a threshold value, and selecting the bias control value that optimizes the bias on the avalanche photo-diode for optimizing the gain of the avalanche photo-diode and increasing signal-to-noise ratio of the optical receiver. The generating of bias control values includes the additional steps of initiating the generation of the bias control values using a nominal bias control value and incrementing the bias on the avalanche photo-diode in the range of about 0.1 volts per each bias control value. The measuring step may further include the step of establishing the threshold value using the nominal bias control value for a statistical measure of the system noise. The selecting step may further include the step of selecting the bias control value preceding the bias control value that first produced system noise greater than the threshold value as the bias control value. The selecting step may further include alternative steps of determining the first occurrence of the bias control value that produces system noise greater than the threshold, generating bias control values that decrease the bias on the avalanche photo-diode, measuring the system noise of the optical receiver for each decreasing bias control value, comparing the measured system noise at each decreasing bias control value to a threshold value, and selecting the bias control value that optimizes the bias on the avalanche photo-diode for optimizing the gain of the avalanche photodiode and increasing the signal-to-noise ratio of the optical receiver.

The present invention further includes an optical time domain reflectometer having an optical source for generating an optical output coupled into an optical fiber under test and an optical receiver having a signal-to-noise ratio for receiving an optical return signal from the test fiber. The optical receiver has a variable gain avalanche photo-diode for converting the optical return signal into an electrical signal and an active avalanche photo-diode gain control circuit having a bias generator coupled to the avalanche photo-diode for biasing the avalanche photo-diode, and a controller coupled to receive the output of the optical receiver and for generating varying bias control values coupled to the bias generator for varying the bias on the avalanche photo-diode with the controller determining system noise of the optical receiver for the various bias control values and comparing the system noise to a threshold value for establishing an optimum bias for optimizing the gain of the avalanche photo-diode and increasing the signal-to-noise ratio of the optical receiver. The controller generates the bias control values from an initial nominal control value producing a bias voltage in the range of about five volts below the breakdown voltage and increments the bias control values to produce changes in the bias voltage in the range of about 0.1 volts. The threshold value for comparison with the system noise is a statistical measure of the system noise and may be generated using the initial nominal control value. A temperature measuring device coupled to the controller may be included for measuring a temperature representative of the temperature of the avalanche photo-diode with the controller comparing the measured temperature to a threshold value for initiating the generation of additional bias control values for re-establishing the optimum bias for the optimum gain of the avalanche photo-diode.

The present invention includes a method for increasing the dynamic range of an optical time domain reflectometer having an optical receiver with a variable gain avalanche photo-diode by generating bias control values for driving a bias generator for varying the bias on the avalanche photo-diode, measuring system noise of the optical receiver for each bias control value, comparing the measured system noise at each bias control value to a threshold value, and selecting the bias control value that optimizes the bias on the avalanche photo-diode while producing system noise no greater than the threshold for optimizing the gain of the avalanche photo-diode and increasing the dynamic range of the optical time domain reflectometer. The generating of bias control values includes the additional steps of initiating the generation of the bias control values using a nominal bias control value in the range of about five volts below the breakdown voltage and incrementing the bias on the avalanche photo-diode in the range of about 0.1 volts per each bias control value. The measuring step may further include the step of establishing the threshold value using the nominal bias control value for a statistical measure of the system noise. The selecting step may further include the step of selecting the bias control value preceding the bias control value that first produced system noise greater than the threshold value as the bias control value. The selecting step may further include alternative steps of determining the first occurrence of the bias control value that produces system noise greater than the threshold, generating bias control values that decrease the bias on the avalanche photo-diode, measuring the system noise of the optical receiver for each decreasing bias control value, comparing the measured system noise at each decreasing bias control value to a threshold value, and selecting the bias control value that optimizes the bias on the avalanche photo-diode while producing system noise no greater than the threshold for optimizing the gain of the avalanche photo-diode and increasing the signal-to-noise ratio or dynamic range of the optical time domain reflectometer. Additional steps for increasing the dynamic range of the optical time domain reflectometer include measuring a temperature representative of the temperature of the avalanche photo-diode, comparing the measured temperature to a threshold value, and initiating the generation of additional bias control values for reestablishing the optimum bias for the optimum gain of the avalanche photo-diode when the change in temperature exceeds the temperature threshold. The objects, advantages and novel features of the present invention are apparent from the following detailed description when read in conjunction with the appended claims and attached drawings.

DETAIL DESCRIPTION OF THE PREFERRED EMBODIMENT

Figure 3:
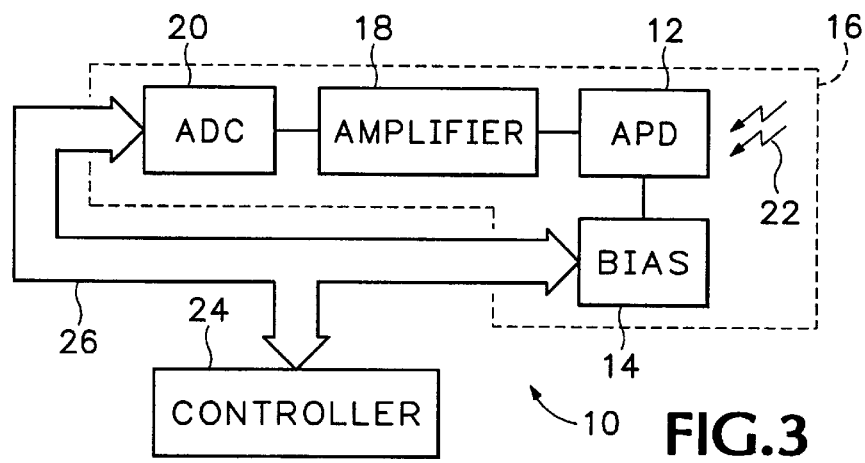
FIG. 3 is a block diagram of the active avalanche photo-diode gain control circuit according to the present invention.

Referring to FIG. 3, there is shown a block diagram of the active avalanche photo-diode bias control circuit 10 for biasing a variable gain avalanche photo-diode, APD according to the present invention. The active avalanche photo-diode bias control circuit 10 varies the output of a bias generator 14 for optimizing the gain of the variable gain APD 12 such as used in an optical receiver 16. The optical receiver 16 includes an amplifier section 18 for amplifying the output of the APD 12 and an analog-to-digital converter, ADC, 20 for receiving and converting the amplified output of the amplifier section 18 to digital values representative of an optical input 22 received at the APD 12. The amplifiers in the amplifier section 18 may be linear transimpedance amplifiers as exemplified in U.S. Pat. No. 5,410,282 or logarithmic amplifiers as exemplified in U.S. Pat. No. 5,012,140, both assigned to the assignee of the present invention. The digital values from the ADC 20 are coupled to a controller 24 via a digital bus 26. Associated with the controller 24 is Random Access Memory, RAM (not shown) for storing the digital values from the ADC 20 and Read Only Memory, ROM, (not shown) for storing programmed instructions that control the functions of the controller 24. Alternately, any programmable type of state machine may be used for controlling the active avalanche photo-diode gain control circuit 10. The APD 12 may be a NDL5551P InGaAs APD, manufactured and sold by NEC, Corp., Tokyo, Japan. The ADC 20 may be a MC10319, manufactured and sold by Motorola, Inc., Schaumburg, Ill. The controller 24 may be a microprocessor, such as a 56166, manufactured and sold by Motorola, Inc., Schaumburg, Ill.

Figure 4:
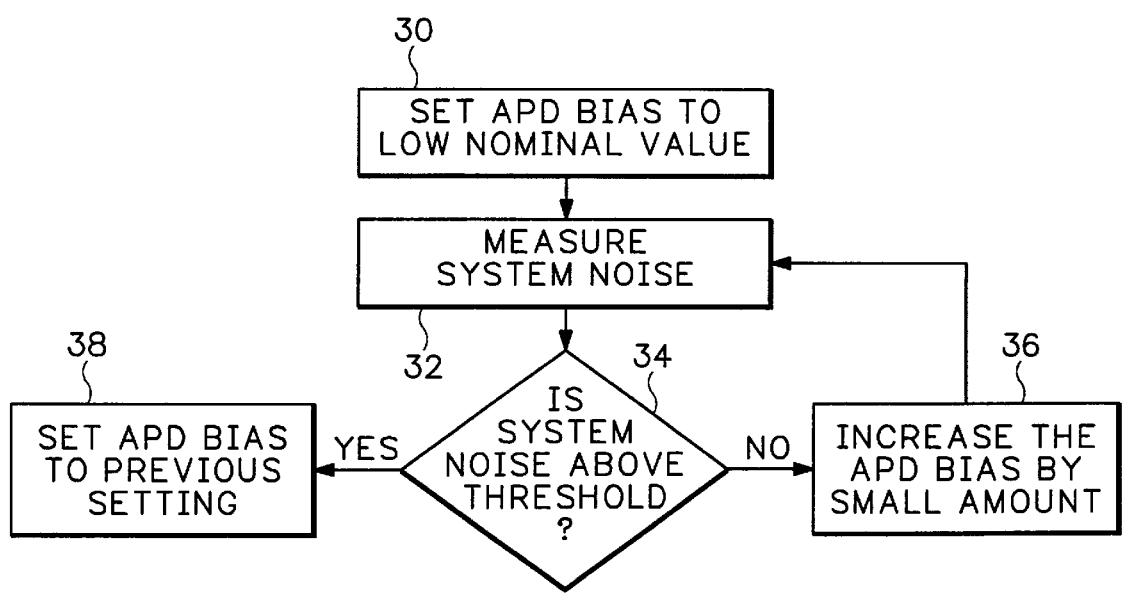
FIG. 4 is a flow chart showing the steps in setting the bias voltage in the active avalanche photo-diode gain control circuit according to the present invention.

The active avalanche photo-diode gain control circuit 10 establishes an optimum bias on the avalanche photo-diode 12 for optimizing the gain of the APD 12 to increase the signal-to-noise ratio of the optical receiver. As previously described, the bias voltage on APDs in the prior art has been set well below the breakdown voltage of the APD to prevent possible destruction of the APD and the failure of any larger system using APDs. However, setting the APD bias voltage well below the breakdown voltage limits the gain of the APD. The present invention overcomes the inherent uncertainties associated with setting the bias voltage on an APD and establishes an APD bias that optimizes the gain of the APD. The optimum bias point depends on the relative importance of the amplifier section 18 system noise. If the system noise is large compared to the noise of APD 12, then the optimum bias point moves closer to breakdown. If the system noise is small, them the optimum bias point moves away from breakdown voltage. The essence of the invention is to optimize the gain of the APD 12 by optimizing the bias on the APD until the noise is essentially equal to the system noise. To this end, a series of steps, as shown in FIG. 4, are performed by the active avalanche photo-diode gain control circuit 10 to establish the optimum APD 12 bias. The bias generator 14 generates varying bias voltages in response to bias control values generated by the controller 24. The controller 24 generates an initial bias control value that produces a bias voltage output from the bias generator 14 that sets the bias on the APD 12 to a low nominal value, as shown in block 30. In the preferred embodiment, the APD bias is set in a range of about five volts below the breakdown voltage of the APD 12. As is understood by those skilled in the art, the breakdown voltage for a particular APD may be different from another APD. The output of the optical receiver is sampled using the ADC 20 without an optical input 22 to the APD 12 to obtain the system noise of the optical receiver using the initial bias setting, as shown in block 32. The system noise is a function of the amplifier section 18. The system noise is measured using a minimum of averaging. The system noise is compared against a threshold value in the controller 24 as shown in decision block 34. In the preferred embodiment, the threshold may be taken as a constant, such as two, multiplied by the standard deviation of the system noise acquired using the nominal bias voltage on the APD 12. Alternately, the threshold value may be a previously stored value representing a statistical measure of the system noise. When the system noise is below the threshold, the controller 24 generates a new bias control value that is coupled to the bias generator 14 for increasing the bias on the APD by an small amount. In the preferred embodiment, the bias on APD 12 is increased in a range of about 0.1 volts as shown in block 36. The system noise is measured at the new bias setting, block 32, and the system noise is compared to the threshold, block 34. As long as the overall system noise, which includes the amplifier section 18 system noise and the APD 12 noise is below the threshold, the controller 24 continues to generate bias control values that increment the bias on the APD 12. When the overall system noise of the optical receiver exceeds the threshold in block 34, the controller 24 generates the bias control value that sets the bias on the APD 12 at the previous bias voltage setting, block 38. The above process establishes the optimum bias voltage on APD 12 for optimizing the gain of a variable gain avalanche photo-diode for increasing the signal-to-noise ratio of an optical receiver.

Figure 1:
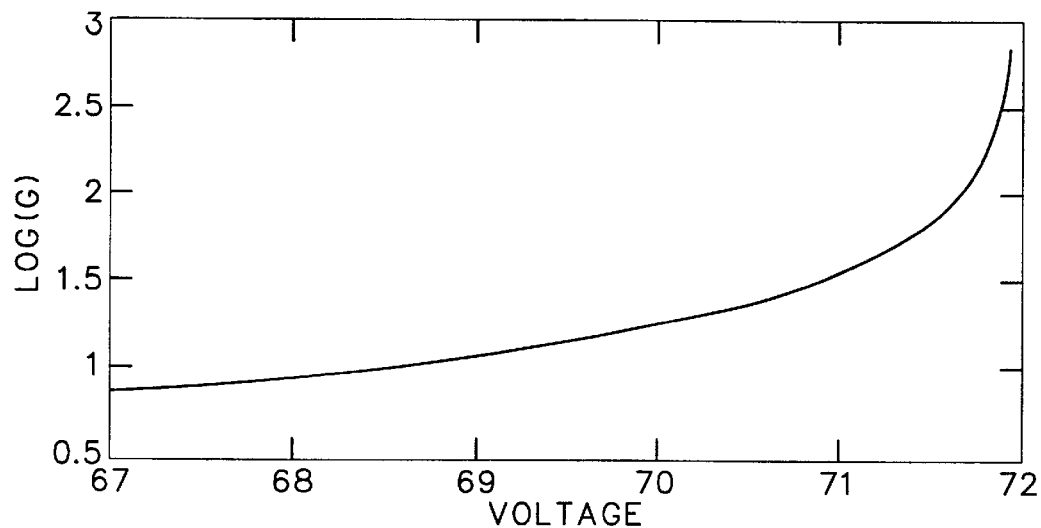
FIG. 1 is a graph showing the typical relationship between bias voltage and gain for an avalanche photo-diode in the active avalanche photo-diode gain control circuit according to the present invention.
Figure 2:
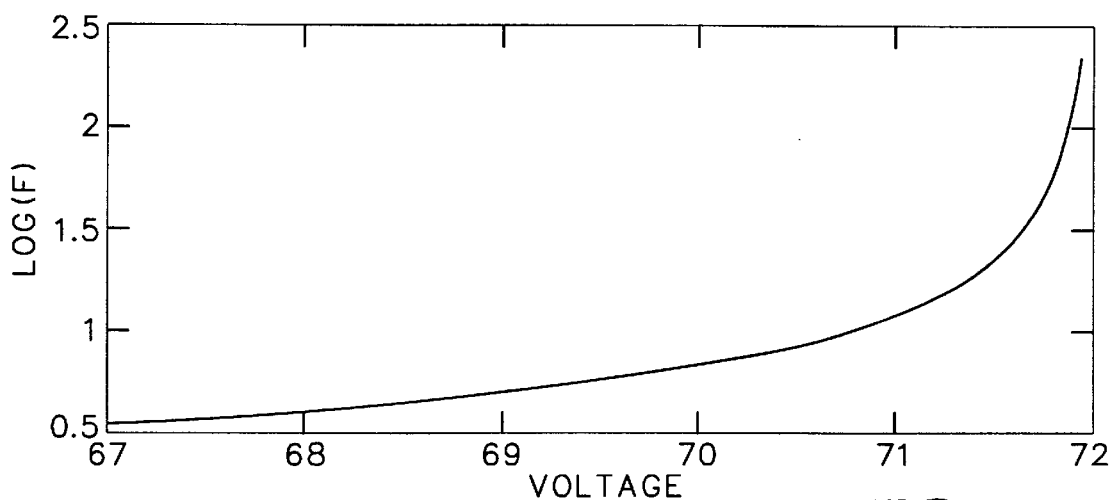
FIG. 2 is a typical graph showing the relationship between bias voltage and excess noise for an avalanche photo-diode in the active avalanche photo-diode gain control circuit according to the present invention.

It should be noted that the above process may be modified by other steps to produce the optimum bias on the APD 12. However, any such modified process needs to take into account the rapid increase in the excess noise of the APD as the bias voltage approaches breakdown as shown in FIG. 2. This rapid increase in excess APD noise translates into a rapid increase in the overall system noise as the bias voltage on the APD is increased. Incrementing the APD 12 bias voltage by to large amount could drive the APD 12 into breakdown damaging or destroying the APD 12. Conversely, incrementing the APD 12 bias by very small amounts, such as 0.01 volts, would have the deleterious effect of substantially increasing the time required to establish the optimum bias on the APD 12. A binary search process may be employed for establishing the optimum bias on the APD 12 but such a process requires knowledge of the breakdown voltage for the APD 12. The breakdown voltage for an APD may be measured but this adds substantial time to the calibration of an optical receiver. Further, as previously described, temperature also introduces a level of uncertainty as to the breakdown voltage. For these reasons, the binary process has a greater risk of driving the APD 12 into breakdown and therefore less desirable than the preferred linear incremental process.

An alternative for establishing the optimum bias for APD 12 may include reversing the bias voltage increments at the first occurrence of the overall system noise being greater than the threshold. In this alternative, the bias voltage on the APD 12 is decreased in steps that are less than the incrementing steps. For example, the above described process increments the bias voltage on APD in 0.1 volts steps. When the bias voltage on the APD 12 produces an overall system noise greater than the threshold, the bias voltage on the APD 12 may be decreased in steps of 0.01 volts until the overall system noise falls below the threshold. The bias voltage on the APD 12 that produces the first occurrence of the overall system noise below the threshold establishes the optimum bias voltage for the APD 12.

The active avalanche photo-diode gain control circuit 10 may be implemented in an optical measurement instrument, such as an optical time domain reflectometer, OTDR, for increasing the dynamic range of the OTDR. There are a number of ways to measure the dynamic range of an OTDR. The most practical way is to determine the difference between the backscatter level near the OTDR's front panel, and the noise floor. Several definitions exist for the noise floor, and discriminating between them is unnecessary for the purposes of the present invention. The important thing to remember about the noise floor used in determining OTDR dynamic range is that it is defined past the end of the fiber under test, where there is no optical signal in the APD. Consequently, the dynamic range of the OTDR is a function of the backscatter level and the dark system noise of the OTDR's optical receiver.

For a single-mode OTDR, the backscatter level is given by equation 3:

$$P_{bs} = \left(\frac{NA}{n}\right)^2 \times \frac{1}{4.55} \alpha_s P_0 W \times 10^{\frac{-6.5}{10}} \quad [3]$$

In equation 3, NA is the fiber's numerical aperture, n is the core index, $\alpha_s$ is the scattering coefficient (1/km), $P_0$ is the incident power, and W is the displayed pulse width. The factor $10^{-6.5/10}$ accounts for the two-way loss through a coupler in the OTDR.

The OTDR's dark-signal noise is a function of the system (amplifier) noise, thermal (Johnson) noise in the APD, and shot noise in the APD arising from the multiplied dark current. The normalized thermal noise in the APD is given by equation 4:

$$i_{Jrms} = \sqrt{4k_b T_{eff} / R} \qquad [4]$$

In equation 4, $k_b$ is Boltzman's constant, $T_{eff}$ is the effective temperature (in Kelvin), B is the bandwidth, and R is the APD's internal resistance. Assuming an internal resistance of 10 Mohns, and a temperature of 375 Kelvin, the normalized Johnson noise is $4.55 \times 10^{-14}$ amp/√Hz. The system (amplifier) noise in a TFS3031 Mini-OTDR is approximately $7 \times 10^{-12}$ amp/√Hz. The shot noise resulting from the amplified dark current is given by Equation 5:

$$i_{SN} = \sqrt{2q(G(v)F(v) \times i_d)} \qquad [5]$$

In equation 5, q is the elementary charge, and $i_d$ is the unmultiplied bulk dark current. Assuming an unmultiplied dark current of 0.5 nA, and a breakdown voltage of 72 volts, the dark current shot noise at 71 volts is $4.0 \times 10^{-12}$ amp/√Hz. From this, it is apparent that the Johnson noise is relatively inconsequential compared to the system noise and the amplified shot noise from the dark current. The total noise is given by equation 6:

$$i_{tot} = \sqrt{i_{SN}^2 + i_{Jrms}^2 + i_{sys}^2} \qquad [6]$$

The dynamic range of the OTDR is defined by the ratio of the received optical backscatter power to the total dark current noise as given by equation 7:

$$DR = 5\log\left(\frac{\left(\frac{NA}{n}\right)^2 \times \frac{1}{4.55} \alpha_s P_0 W \times 10^{\frac{-6.5}{10}}}{\sqrt{i_{SN}^2 + i_{Jrms}^2 + i_{sys}^2}}\right) \qquad [7]$$

Figure 5A:
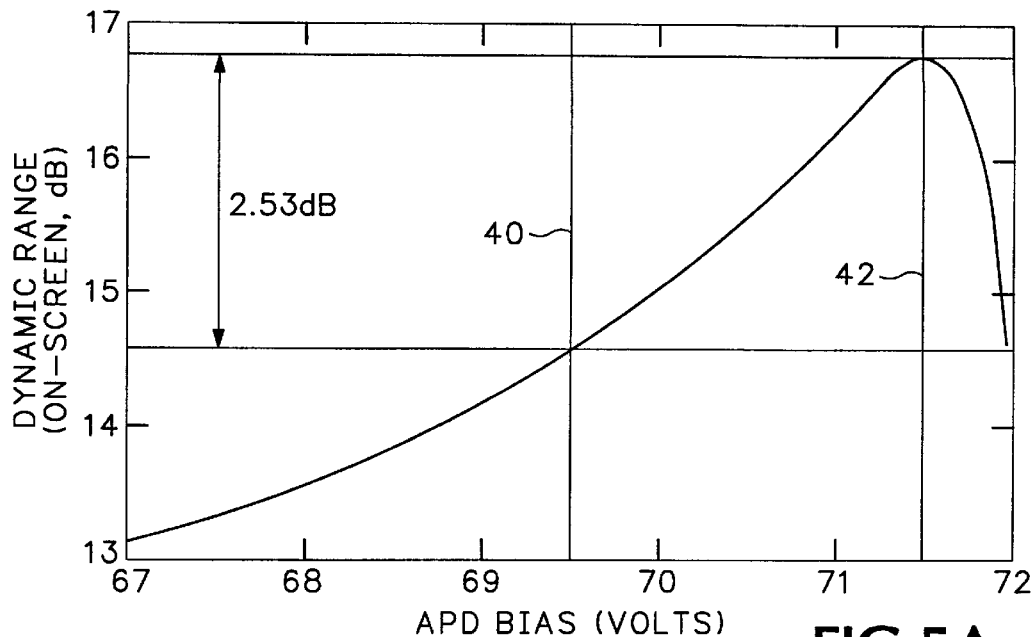
FIG. 5A and 5B are graphs modeling optical time domain reflectometer dynamic range as a function of APD bias.
Figure 5B:
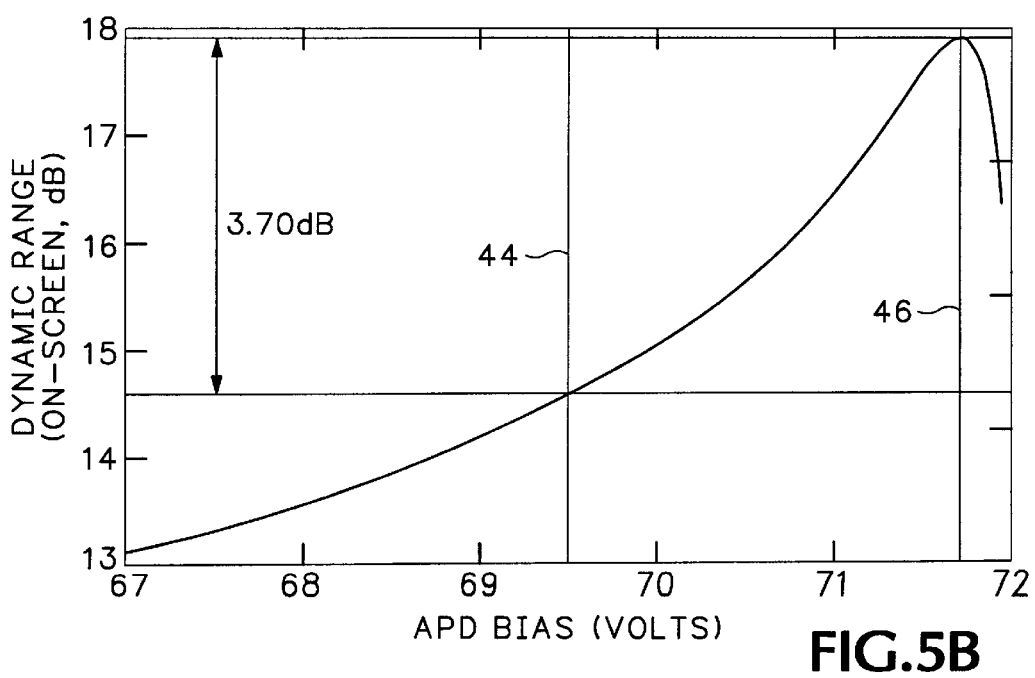

FIGS. 5A and 5B are theoretical results obtained from equation 7 showing how the dynamic range changes with the APD bias voltage. In the models for FIGS. 5A and 5B, an InGaAs APD with k=0.3 is assumed, a quantum efficiency of 0.75, 1550 nm operation 10 meter pulse, 40 MHZ bandwidth, 60 mW laser and single mode fiber. The typical operating bias is about 2.5 volts below the breakdown voltage of 72 volts for the analysis as shown by vertical line 40 in FIG. 5A and vertical line 44 in FIG. 5B. The difference in the results shown in the two figures is the value of the unmultiplied dark currents. In FIG. 5A, the unmultiplied dark current is 0.5 nA producing an optimum bias voltage of about 0.5 volts below breakdown, as shown by vertical line 42. In FIG. 5B, the unmultiplied dark current is 0.1 nA producing an optimum bias of about 0.31 volts below breakdown, as shown by vertical line 46. As previously stated, the optimum bias point depends on the relative importance of the system noise. If the system noise is large compared to the dark noise, then the optimum bias point moves closer to breakdown. If the system noise is small, them the optimum bias point moves away from breakdown voltage. The dark noise generated by the APD is increased by increasing the bias on the APD until the APD dark noise essentially matches the system noise. This increases the gain of the APD which in turn increases the dynamic range of the OTDR as shown by respective dynamic range increases of 2.53 dB and 3.70 dB in FIGS. 5A and 5B.

Figure 6:
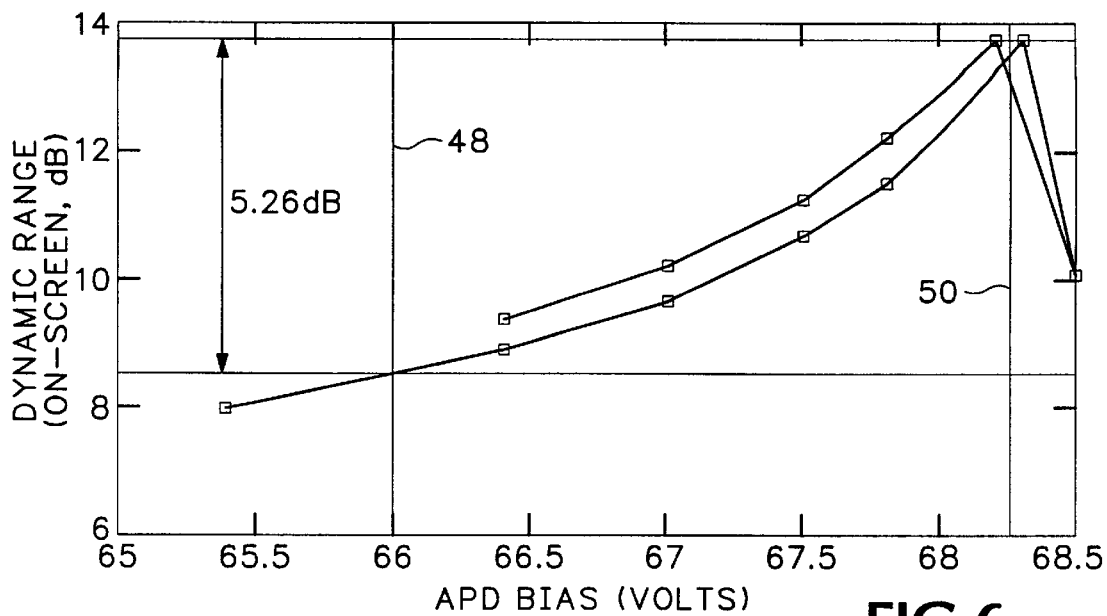
FIG. 6 is a graph showing the relationship between empirically measured dynamic range of an optical time domain reflectometer as a function of the bias voltage on the APD.

Empirical data was obtained manually to verify the theoretical results of equation 7. A TFS3031 Mini-OTDR was modified to allow adjustment of the APD bias voltage. A series of waveforms were acquired at different APD bias voltages and the waveforms were analyzed to calculate the backscatter level and the noise level (at the 98% point) for determining the dynamic range at each APD bias voltage setting. To avoid saturation (or at least to compensate for it) a test fiber was connected to the OTDR using a high-loss jumper. The test fiber also had a high-loss event near the far end. As the APD bias voltage was adjusted, the backscatter level was monitored at the start of the test fiber, and near the end. With each change in the APD bias voltage, the 98% noise level of the dark signal past the end of the fiber was measured. The unsaturated front-panel signal level was used to establish the initial dynamic range, and changes in signal level near the end where there was no saturation to determine the change in dynamic range. FIG. 6 is a plot of the results of the test. The vertical line 48 represents the normal operating bias on the APD which is approximately 2.5 volts below the breakdown voltage. The optimum bias from the test is in the range of about 0.25 volts of the breakdown voltage, shown by vertical line 50, which produces an increase in the dynamic range of the OTDR of about 5.26 dB.

Figure 7:
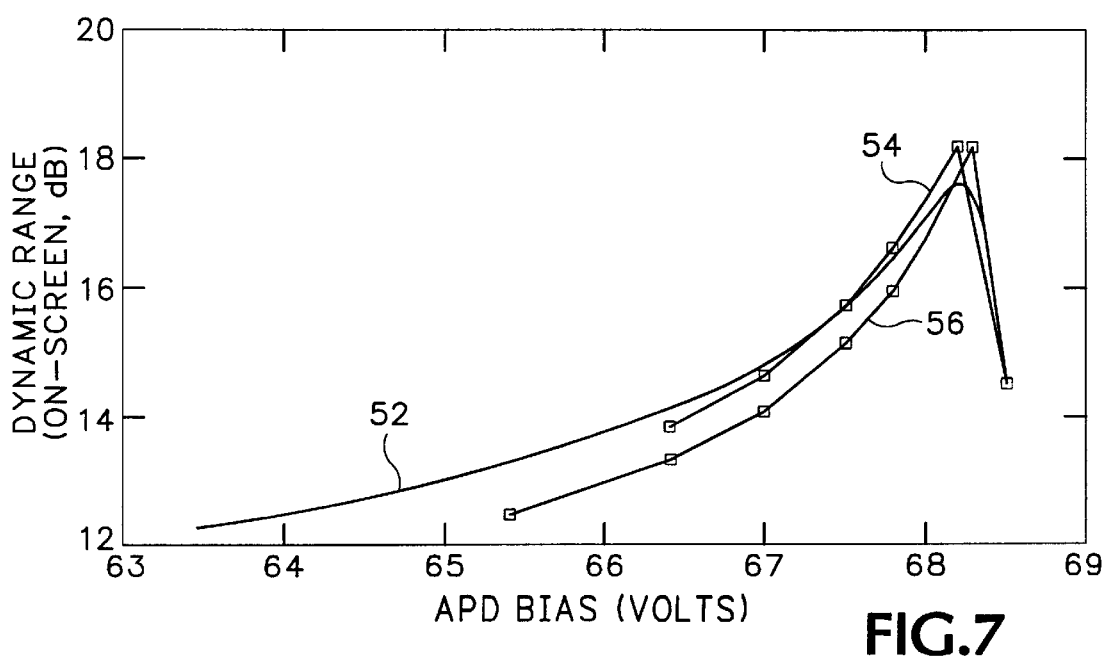
FIG. 7 is a graph showing measured dynamic range and theoretical dynamic range as a function of APD bias.

FIG. 7 compares the theoretical results of equation 7, line 52, with the empirical data acquired using an OTDR, lines 54 and 56. The dynamic range of the theoretical data, which was calculated to a SNR=1 point, has been transposed to the dynamic range calculated to the 98% point. The difference between the two definitions is about 1.5 dB with the SNR=1 definition being higher. Since changes in the dynamic range are only being considered, the precise definition is not important. General agreement between the measured results in FIG. 6 and the theoretically predicted results from equation 7 was achieved with the following assumptions: 1. the unmultiplied bulk dark current is 0.1 nA; 2. the surface dark current (not subject to multiplication) is 4 nA; and 3. the system noise is 10 pA /√HZ.

Figure 8:
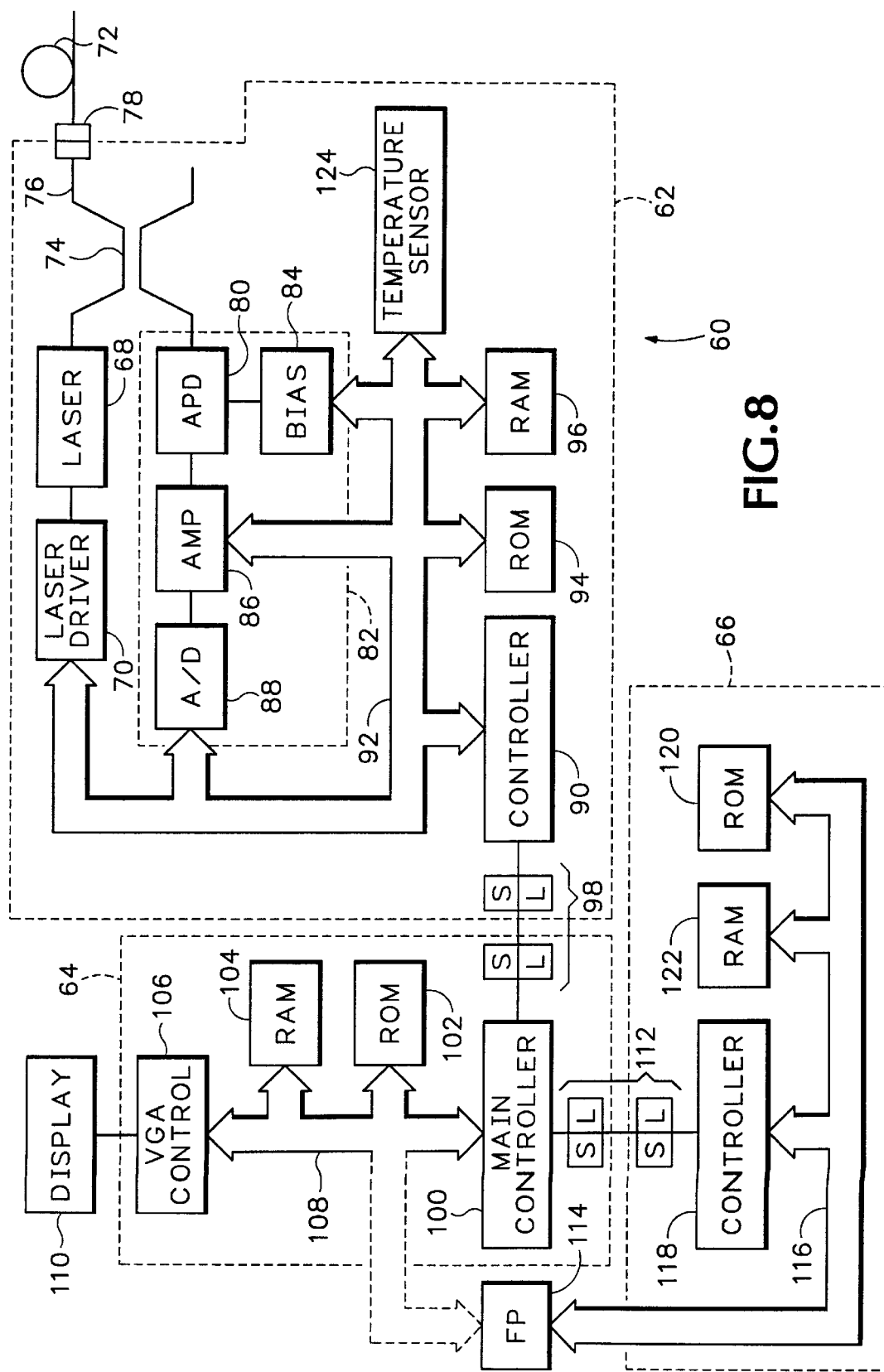
FIG. 8 is a block diagram of a representative optical time domain reflectometer incorporating the active avalanche photo-diode gain control circuit according to the present invention.

The theoretical and empirical results show that the dynamic range of an OTDR may be significantly increased by establishing and optimum bias voltage on an APD that optimizes the gain of the APD. Referring to FIG. 8, there is shown a block diagram of an optical time domain reflectometer 60 incorporating the active avalanche photo-diode gain control circuit according to the present invention. The OTDR comprises a digital acquisition section 62 (DAS), a main processing section 64, and a power supply section 66. The DAS 62 has a laser diode 68 that is energized intermittently by a laser driver 70 to launch interrogating pulses into a test fiber 72 by the way of a directional coupler 74 and a launch fiber 76, which is connected to test fiber 72 by a connector 78. OTDR 60 receives return light from the test fiber 72 due to Rayleigh backscattering and Fresnel reflections. The intensity of the backscattered and reflected light depends on the condition of the test fiber 72.

A portion of the return light received from the test fiber 72 is coupled through coupler 74 to a photodetector 80, such as an avalanche photodiode, APD, in optical receiver 82. The APD 80 generates a current signal representative of the intensity of the return light. The avalanche photodiode 80 is coupled to a voltage biasing circuit 84, which applies a varying voltage to the APD 80 for varying the gain of the device. The current signal from the APD 80 is converted to a voltage signal and amplified by a variable gain transimpedance amplifier stage 86. The amplified voltage signal is sampled and converted to a digital form by analog-to-digital converter (ADC) 88. A digital signal processor controller 90 controls the timing of the ADC 88 relative to the laser driver 70, the voltage output of the voltage biasing circuit 84 and the gain of the transimpedance amplifier stage 86 via digital bus 92 in response to executable routines stored in ROM 94. ROM 94 and RAM 96 are also coupled to the bus 92. RAM 96 accumulates the digital data values from the ADC 88 representative of the light intensity at selected points in the test fiber in a data buffer. Repetitive interrogations of the test fiber 72 provide additional digital data values at the selected points, which are averaged with previously stored values. RAM 96 also stores parameter data passed to the DAS 62 from the main processor section 64 via serial data link 98. The averaged data values in RAM 96 are transferred to the main processor section 64 via the serial data link 98.

The main processor section 64 includes a controller 100, such as a Motorola 68340 microprocessor, coupled to ROM 102, RAM 104 and a display controller 106 via digital bus 108. In the preferred embodiment the ROM 102 is downloadable flash EPROMs and the display controller 106 is a standard VGA type controller coupled to a 640×480 pixel array display device 110, such as a liquid crystal LCD display, cathode ray tube or other device having a rectangular array of addressable pixels. The ROM 102 contains control logic and waveform processing routines. RAM 104 includes a data buffer for receiving the waveform segment data from the DAS 62. RAM 104 also includes a video frame buffer for storing bit mapped data to be displayed on the display device 110.

The main processor section 64 is coupled via a serial link 1 12 is the power supply section 66. The power supply section 66 is coupled to OTDR 60 front panel 114 via digital bus 116. The power supply section 66 includes a controller 118 and associated control programs, stored in ROM 120, for providing power management and front panel control functions and RAM 122 for storing data related to the power management function. The controller 118 poles the front panel 114 to determine if one of the its buttons is pushed. Alternatively, the front panel may be provided with knobs as well as buttons. The controller 118 generates a key code based on the front panel activity and couples the key code to the controller 100 in the main processor section 64 via the serial link 112. The controller 100 generates the appropriate system signal request based on the key code. The OTDR 60 may be battery operated or coupled to a standard 110 volt AC voltage supply. When operating on a battery supply, the controller 118 monitors battery charging and battery usage and provides an indication of battery usage and remaining battery life. An alternative arrangement for OTDR 60 is to couple to the front panel 114 to the controller 100 of the main processor section 64 via digital bus 108.

A temperature sensor 124, such as a thermistor or the like, may be included in the OTDR 60 for tracking the temperature of the APD 80. The temperature sensor 124 may be in physical contact with the APD 80 or in close proximity to the APD 80 for measuring a temperature representative of the temperature of the APD 80. The output of the sensor 124 is coupled to the controller 90 via digital bus 92. Alternately, the sensor 124 may be coupled to the main controller 100 via digital bus 108. The sensor 124 may also be a junction of a transistor, such as a MMBT3904, manufactured and sold by Motorola, Inc., Schaumburg, Ill. The output of the transistor may be coupled to a comparator circuit having as one input a preset value. If the transistor output exceeds the preset value, an interrupt is generated for the controller 90.

The method for establishing the optimum bias point for the APD 80 in OTDR 60 is similar to the steps shown in the flow chart of FIG. 4. The controller 90 generates bias control values that are coupled to the bias generator 84 via digital bus 92 for setting the bias voltage on the APD 80 at a nominal value below the breakdown voltage of the APD 80. In the preferred embodiment, the bias voltage is set in a range of about five volts below the breakdown voltage. The DAS 62 initiates the acquisition of data without firing the laser 68. The acquired data has about one thousand data points using a pulse-repetition rate (PRT) of 100 microseconds. Little averaging of the data is required. In the OTDR 60 shown in FIG. 8. the acquired data is transferred to the main controller 100 over serial link 98 where the RMS or peak-to-peak noise is analyzed and compared against a threshold value. The threshold value may be a pre-stored value stored in ROM 102 or the initially acquired noise data may be stored and used as the threshold value. If the noise is below the threshold, the main controller 100 passes instructions over the serial link 98 to controller 90 for generating a new bias control value that produces a small increase in the bias voltage output of bias generator 84. A new acquisition of data is initiated by the DAS 62 and transferred to the controller 100 for determining the system noise at the new bias setting. This iterative process continues until the measured overall system noise exceeds the threshold. If the noise is above the threshold, the bias on the APD 80 is reduces to the previous value and the controller 100 initiates the regular sequence of events associated with the acquisition of data from the return reflected light from test filer 72. To avoid going into breakdown during acquisition, the temperature sensor monitors the temperature of the APD 80. If the temperature changes by more than a preset value during an acquisition, the acquisition of return reflected light data is stopped momentarily and the procedure shown in FIG. 4 is repeated.

An apparatus and method has been described for optimally setting the APD bias voltage in an optical receiver, such as used in an optical time domain reflectometer or the like. Moving of the APD's operating point to the optimum level increases the system dynamic range or signal-to-noise ratio of the optical receiver by three to five decibels. For an optical time domain reflectometer, improving the dynamic range by this amount provides a number of benefits. For a given amount of dynamic range, the acquisition time is shorter. For example, if it takes 80 seconds to obtain a given dynamic range, then increasing the dynamic range by 3 dB requires averaging for an additional 19.8 minutes assuming averagable noise. Further, if the OTDR dynamic range is satisfactory, then optimally setting the bias voltage on the APD can reduce the acquisition time from 80 second to 10 seconds. The measurement range of the OTDR is improved. Since the increase in dynamic range occurs primarily as a result of increased signal level, optimally setting the APD bias voltage directly improves the OTDR's measurement range. Thus, a 3 dB improvement in dynamic range increases the measurement range by 3 dB for a given amount of averaging and given pulse width. The manufacturing cost is reduced by eliminating the need to measure the breakdown voltage of the APD. Using current technologies, the APD is set to a voltage that depends on its breakdown voltage. This requires the breakdown voltage to be measured for each APD. Dynamic bias control eliminates the need to measure the APD breakdown voltage thus eliminating a production step that requires between 15 and 20 minutes to perform. To achieve similar increases in the dynamic range through increased averaging would require fiber test times to be increased by a factor of between 16 and 100. To achieve such results through increasing the laser power would require laser 4 to 10 times more powerful than those used currently.

It will be obvious to those having skill in the art that many changes may be made to the details of the above-described embodiments of this invention without departing from the underlying principles thereof Accordingly, it will be appreciated that this invention is also applicable to optical receivers applications other than those found in OTDRs. The scope of the present invention should, therefore, be determined only by the following claims.

What is claimed is:

1. An active gain control circuit for a variable gain avalanche photo-diode usable in an optical receiver having a signal-to-noise ratio being a function of the gain of the variable gain avalanche photo-diode comprising:

a bias generator producing a bias that is coupled to the avalanche photo-diode to vary the gain the avalanche photo-diode; and a controller coupled to receive the output of the optical receiver and producing varying bias control values that are coupled to the bias generator to vary the bias on the avalanche photo-diode with the receiver output being generated without an optical signal present on the avalanche photo-diode and the controller determining system noise levels of the optical receiver for the various bias control values and comparing the system noise levels to a threshold value derived from a statistical measure of the optical receiver system noise without an optical signal present for establishing an optimum bias for optimizing the gain of the avalanche photo-diode for increasing the signal-to-noise ratio in the optical receiver.

2. The active gain control circuit as recited in claim 1 wherein the avalanche photo-diode has a breakdown voltage and the controller generates the bias control values from an initial nominal control value that produces an initial bias voltage in the range of about five volts below the breakdown voltage.

3. The active gain control circuit as recited in claim 2 wherein the bias control values are incremented to produce changes in the bias voltage in the range of about 0.1 volts.

4. The active gain control circuit as recited in claim 2 wherein the threshold value is generated using the initial nominal control value.

5. An optical time domain reflectometer having an optical source for generating an optical output coupled into an optical fiber under test and an optical receiver having a signal-to-noise ratio for receiving an optical return signal from the test fiber with the optical receiver having a variable gain avalanche photo-diode responsive to an active gain control circuit for converting the optical return signal into an electrical signal comprising:

a bias generator producing a bias that is coupled to the avalanche photo-diode for biasing the avalanche photo-diode; and a controller coupled to receive the output of the optical receiver and producing varying bias control values that are coupled to the bias generator to vary the bias on the avalanche photo-diode with the receiver output is generated without the optical return signal being present on the avalanche photo-diode and the controller determining system noise levels of the optical receiver for the various bias control values and comparing the system noise levels to a threshold value derived from a statistical measure of the optical receiver system noise without the optical return signal present for establishing an optimum bias for optimizing the gain of the avalanche photo-diode for increasing the signal-to-noise ratio in the optical receiver.

6. The optical time domain reflectometer as recited in claim 5 wherein the avalanche photo-diode has a breakdown voltage and the controller generates the bias control values from an initial nominal control value that produces an initial bias voltage in the range of about five volts below the breakdown voltage.

7. The optical time domain reflectometer as recited in claim 6 wherein the bias control values are incremented to produce changes in the bias voltage in the range of about 0.1 volts.

8. The optical time domain reflectometer as recited in claim 6 wherein the threshold value is generated using the initial nominal control value.

9. The optical time domain reflectometer as recited in claim 5 further comprising a temperature measuring device for measuring a temperature representative of the temperature of the avalanche photo-diode for initiating the generation of additional bias control values for re-establishing the optimum bias for the optimum gain of the avalanche photo-diode when the measured temperature exceeds a preset value.

10. A method of optimizing the gain of a variable gain avalanche photodiode in an optical receiver having a signal-to-noise ratio comprising the steps of:

a) generating bias control values for driving a bias generator for varying the gain of the avalanche photo-diode;

b) measuring a system noise level of the optical receiver for each bias control value using the receiver output with the output being generated without an optical signal being present on the avalanche photo-diode;

c) comparing the measured system noise level at each bias control value to a threshold value derived from a statistical measure of the optical receiver system noise without an optical signal present; and d) selecting the bias control value that produces the bias on the avalanche photo-diode for optimizing the gain of the avalanche photo-diode and increasing the signal-to-noise ratio in the optical receiver.

11. The method of optimizing the gain of the variable gain avalanche photo-diode as recited in claim 10 wherein the generating step further comprises the step of initiating the generation of the bias control values using a nominal bias control value.

12. The method of optimizing the gain of the variable gain avalanche photo-diode as recited in claim 10 wherein the generating step further comprises producing bias control values for incrementing the bias on the avalanche photo-diode in the range of about 0.1 volts per each bias control value.

13. The method of optimizing the gain of the variable gain avalanche photo-diode as recited in claim 11 wherein the measuring step further comprises the step of establishing the threshold value using the nominal bias control value.

14. The method of optimizing the gain of the variable gain avalanche photodiode as recited in claim 10 wherein the selecting step further comprises the step of selecting the bias control value preceding the bias control value that first produced system noise greater than the threshold value as the bias control value.

15. The method of optimizing the gain of the variable gain avalanche photo-diode as recited in claim 10 wherein the selecting step further comprises the steps of a) determining the first occurrence of one of the bias control values that produces a system noise level greater than the threshold;

b) generating bias control values that decrease the bias on the avalanche photo-diode;

c) measuring the system noise level of the optical receiver for each decreasing bias control value;

d) comparing the measured system noise level at each decreasing bias control value to the threshold value; and e) selecting the bias control value that optimizes the bias on the avalanche photo-diode for optimizing the gain of the avalanche photo-diode and increasing the signal-to-noise ratio in the optical receiver.

16. A method for increasing the dynamic range of an optical time domain reflectometer having an optical receiver with a variable gain avalanche photo-diode comprising the steps of:

a) generating bias control values for driving a bias generator for varying the gain of the avalanche photo-diode;

b) measuring system noise levels of the optical receiver for each bias control value using the receiver output with the output being generated without an optical signal being present on the avalanche photo-diode;

c) comparing the measured system noise level at each bias control value to a threshold value derived from a statistical measure of the optical receiver system noise without an optical signal present; and d) selecting the bias control value that optimizes the bias on the avalanche photo-diode while producing system noise no greater than the threshold for optimizing the gain of the avalanche photo-diode and increasing the dynamic range of the optical time domain reflectometer.

17. The method for increasing the dynamic range of an optical time domain reflectometer as recited in claim 16 wherein the generating step further comprises the step of initiating the generation of the bias control values using a nominal bias control value.

18. The method for increasing the dynamic range of an optical time domain reflectometer as recited in claim 16 wherein the generating step further comprises producing bias control values for incrementing the bias on the avalanche photo-diode in the range of about 0.1 volts.

19. The method for increasing the dynamic range of an optical time domain reflectometer as recited in claim 17 wherein the wherein the measuring step further comprises the step of establishing the threshold value using the nominal bias control value.

20. The method for increasing the dynamic range of an optical time domain reflectometer as recited in claim 16 wherein the selecting step further comprises the step of selecting the bias control value preceding the bias control value that first produced system noise greater than the threshold value as the bias control value.

21. The method for increasing the dynamic range of an optical time domain reflectometer as recited in claim 16 wherein the selecting step further comprises the steps of:

a) determining the first occurrence of one of the bias control values that produces a system noise level greater than the threshold;

b) generating bias control values that decrease the bias on the avalanche photo-diode;

c) measuring the system noise level of the optical receiver for each decreasing bias control value;

d) comparing the measured system noise level at each decreasing bias control value to the threshold value; and e) selecting the bias control value that optimizes the bias on the avalanche photo-diode while producing system noise no greater than the threshold for optimizing the gain of the avalanche photo-diode and increasing the dynamic range of the optical time domain reflectometer.

22. The method for increasing the dynamic range of an optical time domain reflectometer as recited in claim 16 further comprising the steps of:

a) measuring a temperature representative of the temperature of the avalanche photo-diode b) comparing the measured temperature to a preset value; and c) initiating the generation of additional bias control values for reestablishing the optimum bias for optimizing the gain of the avalanche photo-diode.

* * * * *